United States Patent [19]

Weber et al.

[11] Patent Number: 4,816,764
[45] Date of Patent: Mar. 28, 1989

[54] METHOD FOR THE IDENTIFICATION OF NUCLEAR MAGNETIC SPECTRA FROM SPATIALLY SELECTABLE REGIONS OF AN EXAMINATION SUBJECT

[75] Inventors: Horst Weber, Adelsdorf; Rolf Sauter, Fuerth, both of Fed. Rep. of Germany

[73] Assignee: Siemens Aktiengesellschaft, Berlin and Munich, Fed. Rep. of Germany

[21] Appl. No.: 218,461

[22] Filed: Jul. 8, 1988

Related U.S. Application Data

[63] Continuation of Ser. No. 78,183, Jul. 27, 1987, abandoned.

[30] Foreign Application Priority Data

Aug. 18, 1986 [DE] Fed. Rep. of Germany ....... 3627939
Apr. 3, 1987 [DE] Fed. Rep. of Germany ....... 3711243

[51] Int. Cl.$^4$ .......................................... G01R 33/20
[52] U.S. Cl. ..................................... 324/309; 324/307
[58] Field of Search ............... 324/300, 307, 309, 311, 324/312, 313, 314, 322; 128/653

[56] References Cited

U.S. PATENT DOCUMENTS

| | | | |
|---|---|---|---|
| 4,021,726 | 5/1977 | Garroway | 324/309 |
| 4,431,968 | 2/1984 | Edelstein | 324/311 |
| 4,471,306 | 9/1984 | Edelstein | 324/311 |
| 4,480,228 | 10/1984 | Bottomley | 324/309 |
| 4,506,223 | 3/1985 | Bottomley | 324/307 |
| 4,629,988 | 12/1986 | Bottomley | 324/322 |

FOREIGN PATENT DOCUMENTS 0086306 8/1983 European Pat. Off. .
0097519 4/1984 European Pat. Off. .
61-102547 10/1984 Japan .

OTHER PUBLICATIONS

"Depth-Resolved Surface-Coil Spectroscopy (DRESS) for in Vivo $^1$H, $^{31}$P, and $^{13}$C NMR," Bottomley et al., J. Mag. Res. vol. 59, (1984) pp. 338–342.
"Magnets, Molecules & Medicine," Gordon, Phys. Med. Biol., vol. 30, No. 8, Aug. 1985, pp. 741–770.
"Experimental Pulse NMR," Fukushima et al., 1981, pp. 174–176.

Primary Examiner—Michael J. Tokar
Attorney, Agent, or Firm—Hill, Van Santen, Steadman & Simpson

[57] ABSTRACT

A method for identifying nuclear magnetic spectra from spatially selectable regions of an examination subject obtains an optimally unattenuated FID signal by the steps of cancelling the magnetization present due to the fundamental magnetic field in volume regions of the examination subject which are not to be evaluated, subjecting the examination subject to a non-selective RF read-out pulse which deflects at least the nuclear spins in the examination regions to be selected, and reading out the resulting FID signal following the non-selective RF read-out pulse. The selected examination region is determined by the transmission/reception characteristics of the coil which receives the FID signal minus the selectively saturated volume region.

4 Claims, 2 Drawing Sheets

U.S. Patent   Mar. 28, 1989   Sheet 1 of 2   4,816,764
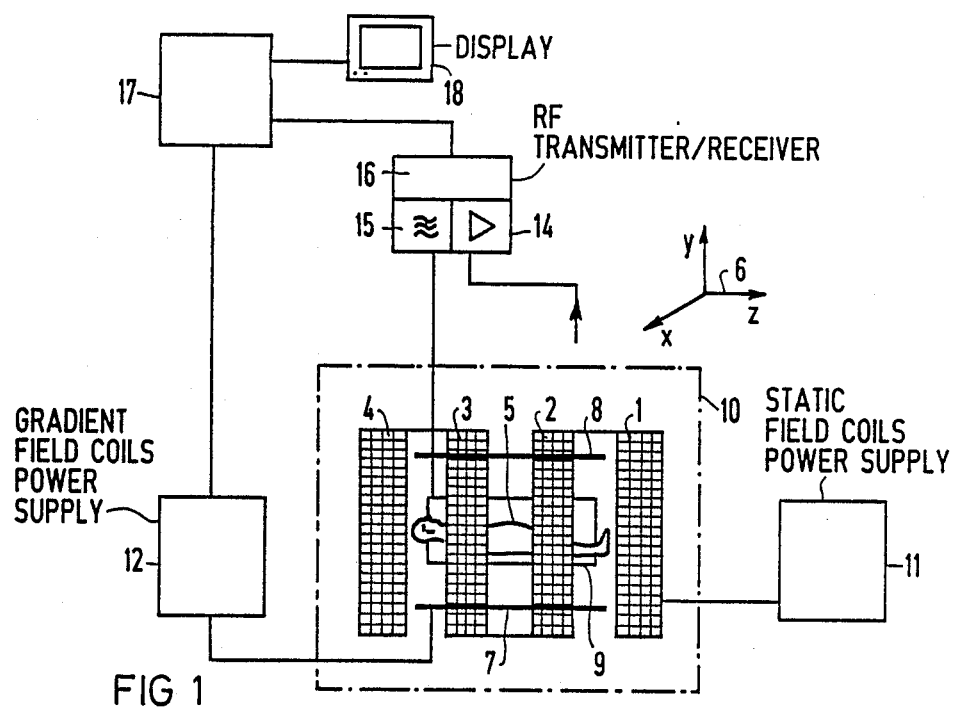
FIG 1
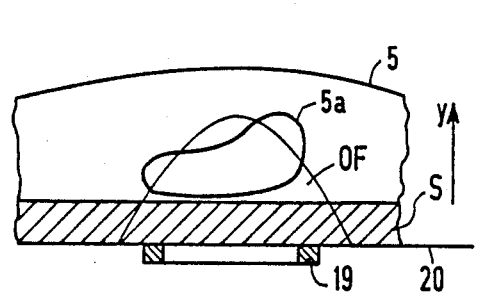
FIG 2
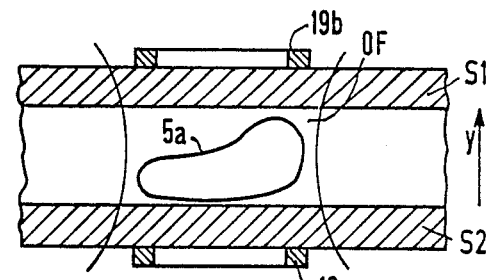
FIG 11
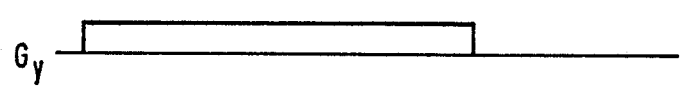
FIG 3   $G_y$
FIG 4   I
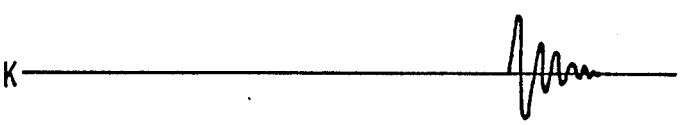
FIG 5   K

METHOD FOR THE IDENTIFICATION OF NUCLEAR MAGNETIC SPECTRA FROM SPATIALLY SELECTABLE REGIONS OF AN EXAMINATION SUBJECT

This is a continuation of application Ser. No. 078,183 filed July 27, 1987, now abandoned.

BACKGROUND OF THE INVENTION

1. Field of the Invention

The present invention is directed to methods for identifying nuclear magnetic spectra from spatially selectable regions of an examination subject which is disposed in a fundamental magnetic field and varying gradient fields as well as being subjected to a sequence of RF pulses for exciting nuclear magnetic resonance in the subject.

2. Description of the Prior Art

Nuclear magnetic resonance devices are known in the art wherein nuclear magnetic resonance signals are obtained from an examination subject which is disposed in a fundamental magnetic field and varying gradient fields, and which has been subjected to a sequence of RF pulses. The resulting nuclear magnetic resonance signals are acquired using a coil disposed in the proximity of the examination region, and spatial selection is achieved by superimposing the transmission/reception characteristic of the coil with a selective slice excitation signal obtained by the combination of a selected gradient field and a frequency-selective RF pulse.

Full topical resolution is generally not employed in nuclear magnetic spectroscopy. The demarcation of individual volume regions of an examination subject, for example an organ, is desired. In a method known from an article by Bottomly et al in the Journal of Magnetic Resonance, Vol. 59, 1984, pages 338–342, the desired volume region is selectively excited for this purpose. The reception as well as the emission of the nuclear magnetic signals occurs by means of a surface coil applied to the examination subject. The reception characteristic and the transmission characteristic of the surface coil are thereby used in combination for the volume selection. When, during the selective excitation, a slice is selected by connecting a magnetic field gradient, a portion of the slice can then be selected on the basis of the characteristics of the surface coil.

This known method, however, presents problems for spectroscopy of compounds having a short relaxation time $T_2$. This is because the selective excitation necessarily lasts a relatively long time, because an RF pulse having a bandwidth corresponding to the slice thickness must be used. The FID signal, which cannot be interpreted until the end of the excitation, has thus already decayed to a relatively great degree given short $T_2$ times. This is particularly true for in-vivo phosphorous spectroscopy.

It is known from U.S. Pat. No. 4,021,726 that spatial selection for imaging a selected slice of an examination subject can be achieved by saturation (cancelling) all spins except those in the selected slice. Read-out of the desired information is accomplished using a 90° excitation pulse, which is applied simultaneously with a read-out gradient. This method, however, is not suitable for spectroscopy because the presence of the read-out gradient would destroy the spectral information.

SUMMARY OF THE INVENTION

It is an object of the present invention to provide a method for identifying nuclear magnetic spectra from spatially selectable regions of an examination subject wherein the unattenuated FID signal can be readily interpreted.

The above object is achieved in accordance with the principles of the present invention in a method wherein volume regions of the examination subject which are not to be evaluated are selectively saturated, the examination subject is charged with a non-selective read-out RF pulse which deflects the nuclear spins at least in the examination regions to be selected, and the resulting FID signal is read-out immediately following the non-selective RF read-out pulse.

As used herein, the term "saturation" means that any magnetization which is present due to the fundamental magnetic field is destroyed or cancelled.

The above-described method has the advantage that the RF read-out pulse can be maintained extremely short, because it is not selective. In comparison to selective pulses, such non-selective pulses can have an arbitrarily wide frequency band, which corresponds in the time domain to a time span approaching zero in the ideal case. Substantially the full initial amplitude of the FID signal is thus available, so that nuclei having short $T_2$ relaxation times can be investigated without difficulty.

The boundary of the volume region to be evaluated can be selected by selective saturation of a plurality of slices. A volume region which is precisely definable in three-dimensional terms can thus be demarcated.

DESCRIPTION OF THE DRAWINGS

FIG. 1 is a schematic diagram showing a nuclear magnetic resonance apparatus for magnetic spectroscopy for practicing the method disclosed herein.

FIG. 2 is a schematic showing of the selective saturation of a slice of an examination subject.

FIGS. 3, 4 and 5 are graphs showing a first example of an excitation sequence in accordance with the method disclosed herein.

FIG. 11 is a schematic showing of the selective saturation of two parallel slices of an examination subject.

DESCRIPTION OF THE PREFERRED EMBODIMENTS

Figure 6:
FIGS. 6, 7, 8, 9 and 10 are graphs showing a second example of an excitation sequence according to the method disclosed herein.

The basic structure of a nuclear magnetic resonance device for producing nuclear magnetic spectra of an examination subject is shown in FIG. 1. A fundamental magnetic field is generated by coils 1, 2, 3 and 4 in which an examination subject 5 is disposed. The examination subject 5 is also disposed in magnetic field gradients which are generated by a separate set of coils. Gradient coils 7 and 8 are shown in the drawing, which generate a magnetic field gradient in the y-direction, in accordance with the axes indicated at 6. Other gradient coils (not shown) are present for generating gradient fields in the z and x directions. The apparatus also includes a whole-body antenna 9 for generating the nuclear magnetic resonance signals.

The coils 1, 2, 3, 4, 7, 8 and 9 bounded by the dot-dash line represent the portion of the device in which the patient is disposed. The coils therein are operated by a power supply 11 for the coils 1, 2, 3 and 4, and a power supply 12 for the coils 7 and 8 (and the other gradient coils not shown). A coil for receiving the nuclear magnetic resonance signals (not shown in FIG. 1) is coupled to a control computer 17 through a signal amplifier 14. The control computer 17 generates an output of the spectrum on a display device 18. The whole-body antenna 9 is connected to an RF transmitter 15. The components 14 and 15 are parts of a RF transmitter/receiver unit for signal generation and pick-up.

A portion of the examination subject 5 is shown in FIG. 2. The examination subject 5 lies on a patient support 20. An organ 5a, such as the liver, is to be spectroscopically examined. For this purpose, the examination subject 5 is charged with a pulse sequence as shown in FIGS. 3 through 5. First, the gradient $G_y$ shown in FIG. 3 is generated in the y-direction. Subsequently, a sequence of RF pulses differing in amplitude as shown in FIG. 4 selectively saturates the slice referenced S in FIG. 2, i.e., the magnetization previously present due to the fundamental or static magnetic field is destroyed or cancelled within this slice S. The full slice S, however, is only saturated when the RF pulses are generated by the whole-body antenna 9 covering the entire examination subject 5. It is also possible, however, to generate the RF pulses by a surface coil 19, schematically shown in FIG. 2, which would be connected to the RF transmitter 15. Use of the surface coil 19 essentially charges the examination subject 5 with pulses only in a region OF shown in FIG. 2. Thus only that portion of the slice S coincident with the region OF is saturated. The region OF is, not sharply demarcated.

After saturation of the slice S, which is not to be interpreted, has been completed, the examination subject 5 is charged with an RF pulse. If such charging is undertaken using a surface coil 19, only the spins in the region OF are displaced, otherwise all spins of the examination subject 5 are displaced. Insofar as a magnetization was previously present, i.e., outside of the saturated slice S, a FID signal thus arises, which is shown in FIG. 5. If the surface coil 19 has been used, this FID signal in the region OF will be acquired by the coil 19 and supplied to the control computer 17 for evaluation through the signal amplifier 14. The transmission/reception characteristic of the surface coil 19 is thus always effective in the reception case, even if excitation is undertaken by means of the whole-body antenna 9.

Using the described excitation sequence, the signal components of the FID signal are essentially received from the region OF minus the slice S. These signals are then spectroscopically evaluated.

The above-described method of volume selection has the advantage that the non-selective pulse, indicated at I in FIG. 4, can be made extremely short, so that substantially the full initial amplitude of the rapidly decaying FID signal is available for the immediately following interpretation. The duration of the selective saturation thus does not have a disturbing effect on the FID signal, and is limited only by the longitudinal relaxation time $T_1$.

Another emobdiment of the method for selective saturation of the examination region 5a in shown in FIGS. 6 through 9. The pulse sequency shown and described below is applied n times. As shown in FIG. 6, a frequency-selective RF pulse $I_n$ is supplied in combination with a gradient pulse $G_n$. The magnetization in the selected slice is thus rotated by an angle α. A spoiler gradient $G_{S_n}$ is subsequently applied, which generates an artificial inhomogeneity in the magnetic field, thus leading to a de-phasing of the spin. The transverse magnetization component is thus destroyed or cancelled first. This pulse sequence is repeated n-times with different high frequency amplitudes as well as with different orientation and duration of the spoiler gradients. The desired slices are thus saturated i this manner.

Figure 7:
Figure 8:
Figure 9:
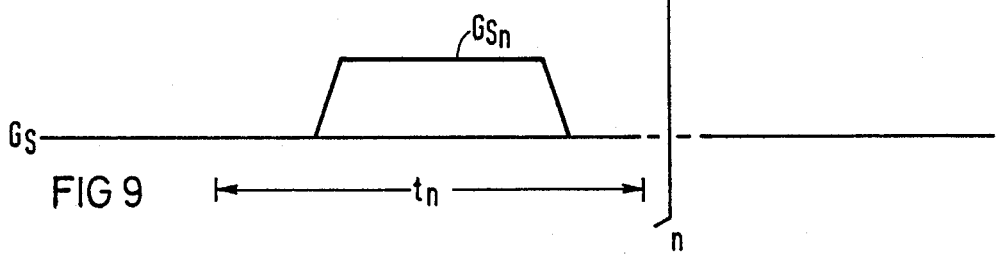

After saturation, i.e., after n-applications, no macroscopic magnetization outside of the volume of interest exists in the ideal case. The spectral information from the selected volume is then read-out by a brief, non-selective RF pulse $I_2$, as shown in FIG. 6. The signal of interest, referenced K in FIG. 7, is received in response to the non-selective RF pulse $I_2$.

Optimization of the saturation sequence can be achieved by varying the amplitudes and the spaces between successive RF pulses $I_n$. Given a prescribed number N of saturation elements, best results are achieved when the amplitudes $A_n$ of the RF pulses $I_n$ decrease according to a geometrical series $A_n = f^n \cdot A_1$. A value of f=0.9 has been determined to be beneficial. The time interval $t_n$ between two successive selective RF pulses $I_n$ is determined by the relation $t_n = t_1 \cdot g^n$, wherein a value of g=0.83 has been determined to be beneficial. The coherency produced by the repeated application of RF pulses is thus destroyed.

Figure 10:
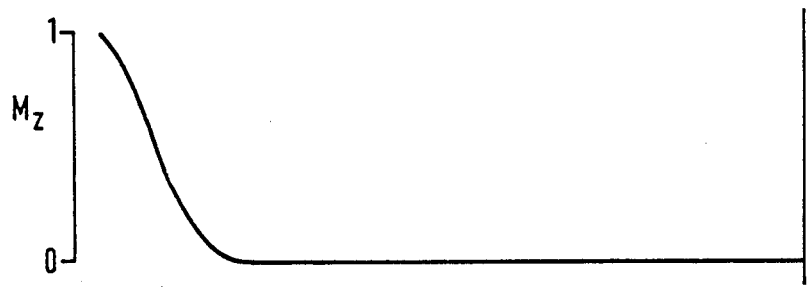

The remaining longitudinal magnetization component of the spin system following such an excitation sequence consisting of 10 applications (N=10) was calculated under the assumption that the longitudinal relaxation time is long with respect to the overall duration of the saturation period. As shown in FIG. 10, a simultaneous saturation ensues over the entire selected volume region when the original RF pulse has an angle of more than 140°.

As noted above, the region OF is not sharply demarcated. Moreover, the shape of the volume region to be evaluated is not always in agreement with the shape of the region OF prescribed by the surface coil 19.

A sharper demarcation of the volume region to be evaluated, as well as the planar limiting surfaces thereof, are possible when, as shown in FIG. 11, a further slice S1, parallel to the slice S, is saturated. Thus a volume region to be evaluated within the region OF is limited by the slices S and S1. For this purpose, it is only necessary that selective RF pulses have to be applied simultaneously with the connection of the gradient $G_y$.

It is thus particularly advantageous when the duration of the saturation is limited only by the relaxation time $T_1$, so that the FID signal remains independent of the duration of the saturation procedure. The $T_1$ relaxation time, however, is relatively long, for example, for in-vivo phosphorous spectroscopy which has a relatively short $T_2$ relaxation time.

In the exemplary embodiment of FIG. 11, a Helmholtz coil consisting of two windings 19a and 19b disposed opposite each other encompassing the examination region 5a therebetween was used instead of the surface coil 19. The Helmholtz coil also has a transmission/reception characteristic referenced OF.

Although modifications and changes may be suggested by those skilled in the art it is the intention of the inventors to embody within the patent warranted hereon all changes and modifications as reasonably and properly come within the scope of their contribution to the art.

We claim as our invention:

1. A method for identifying nuclear magnetic spectra in a spatially selectable evaluation region of an examination subject comprising the steps of:
   generating a fundamental magnetic field in which said examination subject is disposed;
   generating nuclear magnetic resonance signals in a selected volume of said examination subject by applying at least one RF pulse generated by an RF coil to said examination subject, said volume being selected by the transmission/reception characteristics of said RF coil;
   selectively saturating volume regions of said examination subject which are not to be evaluated;
   applying a non-selective RF read-out pulse generated by said RF coil to said examination subject which deflects the nuclear spins at least in said evaluation region and which causes a FID signal to be generated; and
   reading out said FID signal immediately following the application of said non-selective RF read-out pulse.

2. A method as claimed in claim 1, wherein the step of selectively saturating volume regions of said examination subject which are not to be evaluated is further defined by saturating a plurality of slices of said examination subject by which said evaluation region is bounded.

3. A method as claimed in claim 1, wherein the step of saturating said volume regions of said examination subject which are not to be evaluated is further defined by applying a sequence of RF pulses having different amplitudes simultaneously with at least one gradient magnetic field.

4. A method as claimed in claim 1, wherein the step of selectively saturating said volume regions of said examination subject which are not to be evaluated is further defined by repeating the following steps n times:
   applying a frequency-selective RF pulse to said patient simultaneously with a magnetic field gradient; and
   applying a spoiler gradient to said examination subject following said frequency-selective RF pulse, with the amplitude of the frequency-selective RF pulse and the direction and duration of the spoiler gradient being changed with each repetition.

* * * * *